US008750037B2

(12) United States Patent
Toh et al.

(10) Patent No.: US 8,750,037 B2
(45) Date of Patent: Jun. 10, 2014

(54) NON-VOLATILE MEMORY UTILIZING IMPACT IONIZATION AND TUNNELLING AND METHOD OF MANUFACTURING THEREOF

(75) Inventors: Eng Huat Toh, Singapore (SG); Chung Foong Tan, Singapore (SG); Shyue Seng Tan, Singapore (SG); Jae Gon Lee, Singapore (SG); Elgin Quek, Singapore (SG)

(73) Assignee: Globalfoundries Singapore PTE. Ltd., Singapore (SG)

( * ) Notice: Subject to any disclaimer, the term of this patent is extended or adjusted under 35 U.S.C. 154(b) by 0 days.

(21) Appl. No.: 12/456,440

(22) Filed: Jun. 16, 2009

(65) Prior Publication Data

US 2010/0315884 A1    Dec. 16, 2010

(51) Int. Cl.
   *G11C 16/04* (2006.01)

(52) U.S. Cl.
   USPC ............... 365/184; 365/185.18; 365/185.24; 365/185.14; 257/314; 257/315; 257/324; 257/325; 257/326

(58) Field of Classification Search
   USPC ................... 365/185.18, 185.24, 185.14, 184; 257/314–326, 481, 482
   See application file for complete search history.

(56) References Cited

U.S. PATENT DOCUMENTS

| | | | | |
|---|---|---|---|---|
| 5,411,905 | A * | 5/1995 | Acovic et al. | 438/156 |
| 5,451,800 | A * | 9/1995 | Mohammad | 257/191 |
| 5,814,853 | A * | 9/1998 | Chen | 257/315 |
| 5,991,204 | A * | 11/1999 | Chang | 365/185.29 |
| 6,097,056 | A * | 8/2000 | Hsu et al. | 257/315 |
| 6,313,486 | B1 * | 11/2001 | Kencke et al. | 257/192 |
| 6,317,360 | B1 * | 11/2001 | Kanamori | 365/185.01 |
| 7,964,907 | B2 * | 6/2011 | Choi et al. | 257/316 |
| 2003/0137006 | A1 * | 7/2003 | Chan et al. | 257/315 |
| 2006/0202254 | A1 * | 9/2006 | Lai et al. | 257/315 |
| 2008/0093664 | A1 * | 4/2008 | Yun et al. | 257/324 |
| 2008/0290401 | A1 * | 11/2008 | Yasui et al. | 257/324 |

* cited by examiner

*Primary Examiner* — Huan Hoang
*Assistant Examiner* — Jay Radke
(74) *Attorney, Agent, or Firm* — Robert D. McCutcheon

(57) ABSTRACT

A non-volatile memory device (and method of manufacture) is disclosed and structured to enable a write operation using an ionization impact process in a first portion of the device and a read operation using a tunneling process in a second portion of the device. The non-volatile memory device (1) increases hot carrier injection efficiency, (2) decreases power consumption, and (3) enables voltage and device scaling in the non-volatile memory devices.

8 Claims, 12 Drawing Sheets

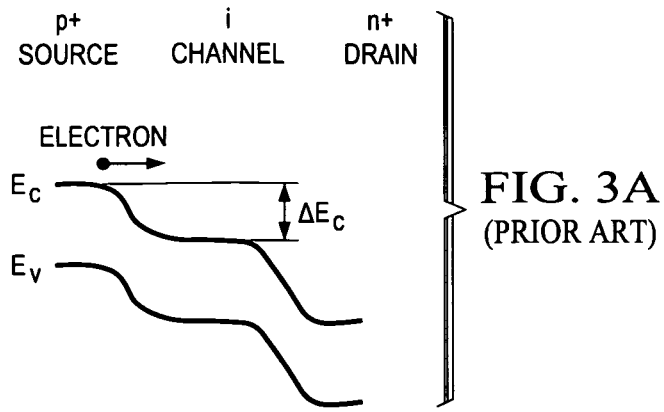
FIG. 3A
(PRIOR ART)
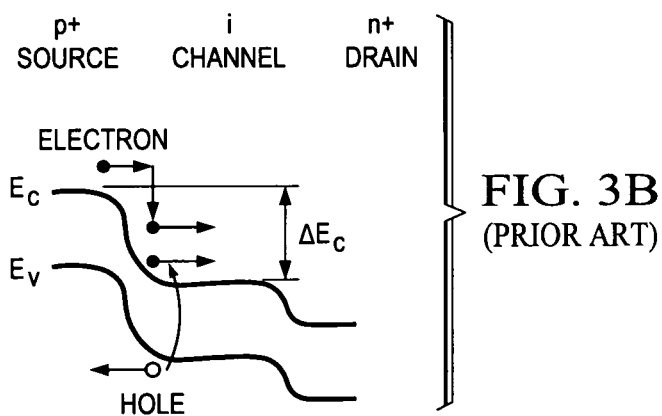
FIG. 3B
(PRIOR ART)
| MODE | $V_S$ | $V_D$ | $V_G$ |
|---|---|---|---|
| OFF | (- -) | (+) | GND |
| ON | (- -) | (+) | (+) |
FIG. 4
(PRIOR ART)

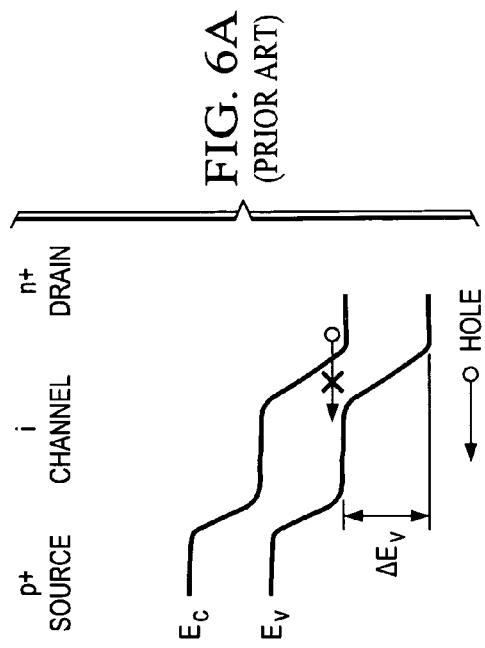
FIG. 5 (PRIOR ART)
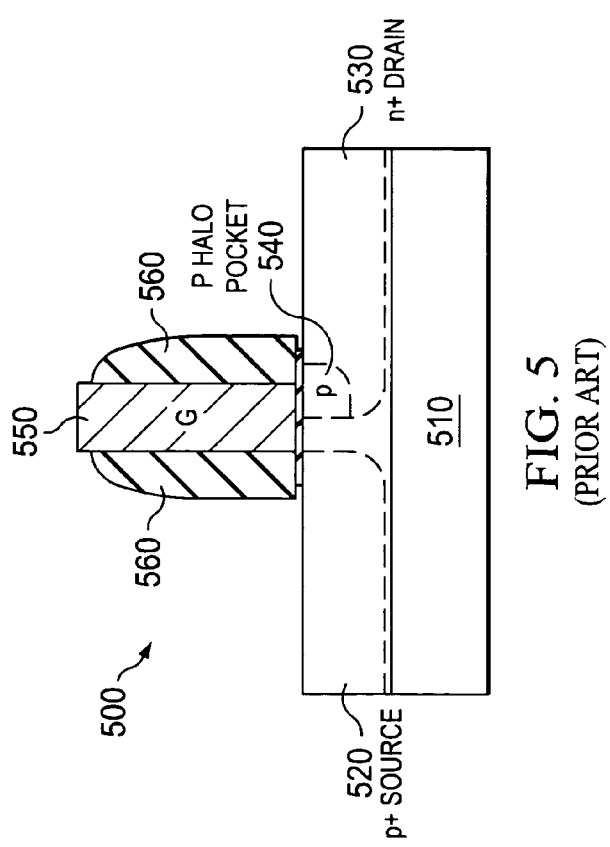
FIG. 6A (PRIOR ART)
FIG. 6B (PRIOR ART)
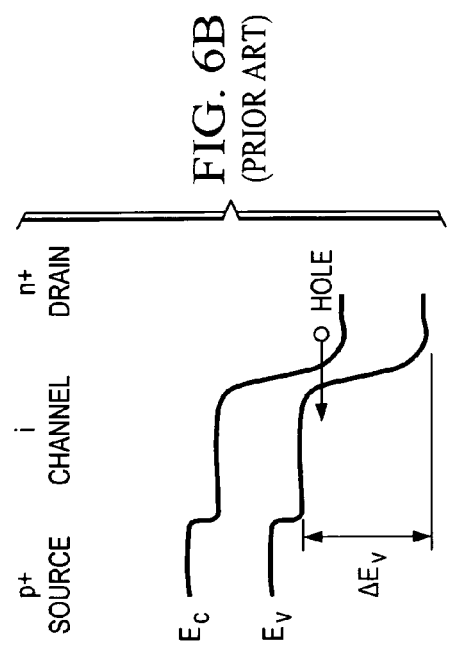
FIG. 7 (PRIOR ART)

| MODE | $V_S$ | $V_D$ | $V_G$ | $V_{sub}$ |
|---|---|---|---|---|
| I-MOS → PROGRAM | (- -) | (+) | (+) | GND |
| ERASE | GND | GND | (++) | GND |
| TFET → READ | (-) | GND | (-) | GND |
FIG. 10
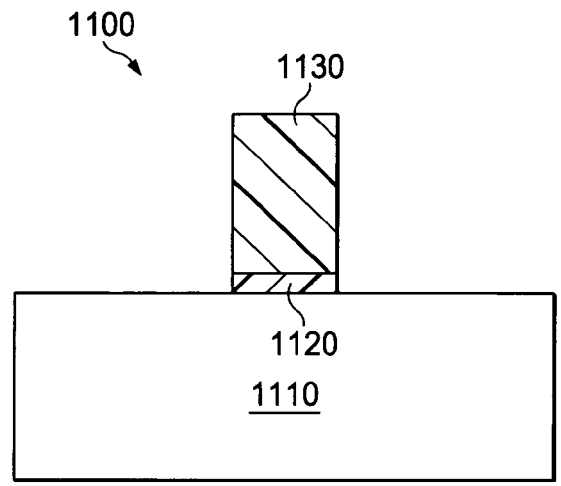
FIG. 11
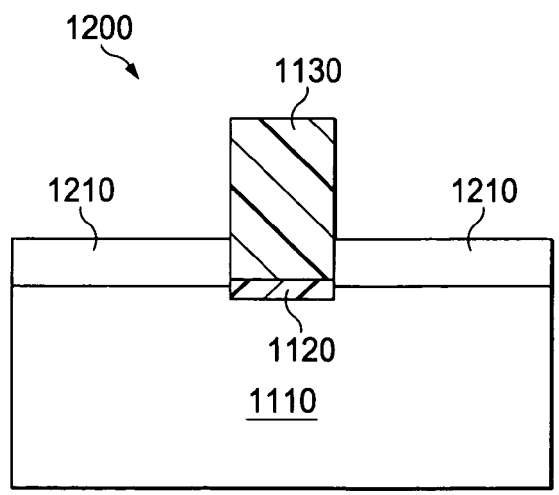
FIG. 12

NON-VOLATILE MEMORY UTILIZING IMPACT IONIZATION AND TUNNELLING AND METHOD OF MANUFACTURING THEREOF

TECHNICAL FIELD

The present disclosure relates generally to the manufacture of semiconductor devices, and more particularly, to the manufacture of integrated circuits having non-volatile memory devices.

BACKGROUND

Non-volatile memory (NVM) technology has faced immense challenges in attempting to improve the writing/reading speed and injection efficiency of hot carriers into the tunneling oxide of a memory cell. Non-volatile memory (NVM) devices utilizing a channel hot electron (CHE) injection process are generally inefficient. This inefficiency results in a low writing speed and a need for a large area to adequately perform the CHE injection process. Non-volatile memory (NVM) devices utilizing a Fowler-Nordheim tunneling process are generally more efficient; however, this process has low read performance. As a result, there is a fundamental limit on the speed and scaling of conventional non-volatile memory (NVM) devices.

FIG. 1 is a diagram illustrating a cross sectional side view of a prior art non-volatile memory (NVM) device 100 programmable using the CHE process. The device 100 includes a substrate 110, an n+ source region 120 and an n+ drain region 130 formed in the substrate 110 by conventional processing methods. A floating gate 140 is formed and disposed above a channel (with a dielectric layer there between) between the source region 120 and the drain region 130. The floating gate 140 may be constructed of poly-gate, nitride, or nanocrystals, or a combination thereof, as known in the art. A control gate 150 is formed and disposed over the floating gate 140. The sides of the floating gate 140 and the sides of the control gate 150 are supported by sidewall spacer structures 160.

In the channel hot electron (CHE) process, a relatively few "lucky" electrons get injected into the tunneling oxide (disposed between the substrate 110 and the floating gate 140. The generation process is slow and the carrier injection process is indirect and inefficient. This results in a relatively slow writing/reading speed for conventional non-volatile memory (NVM) devices. The injection efficiency of the hot carriers is also relatively low. These problems limit the device scalability of such non-volatile memory (NVM) devices.

Accordingly, there is a need in the art for an improved non-volatile memory (NVM) device (and method of manufacture) having an increased writing/reading speed. There is also a need in the art for an improved non-volatile memory (NVM) device (and method of manufacture) that increases the hot carrier injection efficiency. There is also needed in the art an improved non-volatile memory (NVM) device (and method of manufacture) that decreases power consumption and enables voltage and device scaling.

SUMMARY

In accordance with one advantageous embodiment, there is provided a non-volatile memory device configured to perform a write operation using (or in accordance with) an ionization impact process and perform a read operation using (or in accordance with) a tunneling process. In another embodiment, there is provided the non-volatile memory device described above further including a substrate; source and drain regions within the substrate; at least a portion of a gate structure disposed between the source region and the drain region; and an impact ionization region disposed between the source region and the gate structure.

In another embodiment, there is provided a method for operating a non-volatile memory device. The method includes performing a write operation using an ionization impact process in a first portion of the non-volatile memory device and performing a read operation using a tunneling process in a second portion of the non-volatile memory device.

In still another embodiment, there is provided a method of manufacturing a non-volatile memory device. The method includes providing a substrate; forming source and drain regions within the substrate; forming a gate structure at least partially disposed between the source region and the drain region wherein the gate structure includes a tunnel oxide layer, a floating gate formed over the tunnel oxide layer and a control gate formed over the floating gate. The method also includes forming an impact ionization region between the source region and the gate structure and forming a halo region in the drain region at a location adjacent the gate structure.

The foregoing has outlined rather broadly the features and technical advantages of the present disclosure so that those skilled in the art may better understand the detailed description that follows. Additional features and advantages of the present disclosure will be described hereinafter that form the subject of the claims. Those skilled in the art should appreciate that they may readily use the concept and the specific embodiment(s) disclosed as a basis for modifying or designing other structures for carrying out the same or similar purposes of the present disclosure. Those skilled in the art should also realize that such equivalent constructions do not depart from the spirit and scope of the claimed invention in its broadest form.

Before undertaking the Detailed Description below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior uses, as well as future uses, of such defined words and phrases.

BRIEF DESCRIPTION OF THE DRAWINGS

For a more complete understanding of the present disclosure, and the advantages thereof, reference is now made to the following descriptions taken in conjunction with the accompanying drawings, wherein like numbers designate like objects, and in which:

FIG. 3A is a diagram illustrating an energy band diagram for an "off state" of the prior art impact ionization metal oxide semiconductor (I-MOS) device that is shown in FIG. 2;

FIG. 3B is a diagram illustrating an energy band diagram for an "on state" of the prior art impact ionization metal oxide semiconductor (I-MOS) device that is shown in FIG. 2;

FIG. 4 is a diagram illustrating a table that shows the operating voltages for the prior art impact ionization metal oxide semiconductor (I-MOS) device that is shown in FIG. 2;

FIG. 5 is a diagram illustrating a cross sectional side view of a prior art tunneling field effect transistor (TFET) device;

FIG. 6A is a diagram illustrating an energy band diagram for an "off state" of the prior art tunneling field effect transistor (TFET) device that is shown in FIG. 5;

FIG. 6B is a diagram illustrating an energy band diagram for an "on state" of the prior art tunneling field effect transistor (TFET) device that is shown in FIG. 5;

FIG. 7 is a diagram illustrating a table that shows the operating voltages for the prior art tunneling field effect transistor (TFET) device that is shown in FIG. 5;

FIG. 10 is a diagram illustrating a table that shows the operating voltages for the impact ionization tunneling (IT) non-volatile memory (NVM) device shown in FIG. 8;

FIG. 11 through FIG. 22 are diagrams that illustrate a series of steps of one embodiment of a method or process for manufacturing an impact ionization tunneling (IT) non-volatile memory (NVM) device in accordance with the present disclosure;

DETAILED DESCRIPTION

Figure 1:
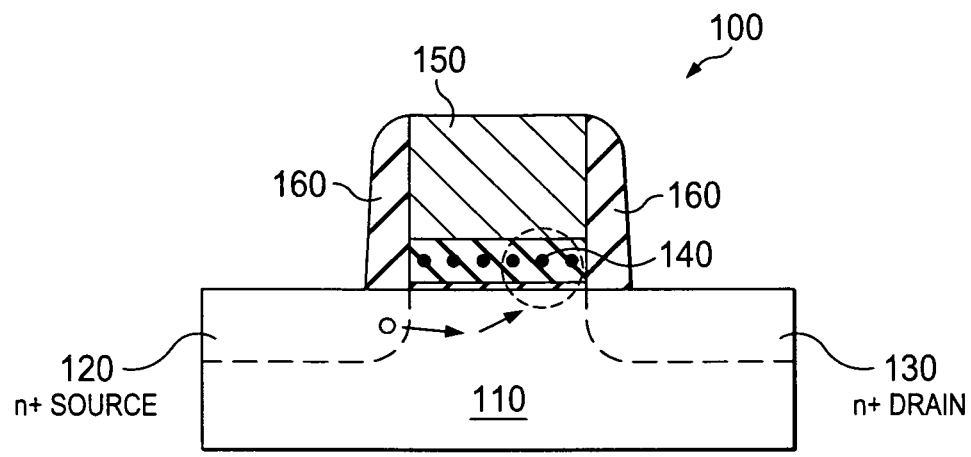
FIG. 1 is a diagram illustrating a cross sectional side view of a prior art non-volatile memory (NVM) device that is programmed using a channel hot electron (CHE) method.

FIGS. 2 through 25 and the various embodiments used to describe the principles of the present disclosure in this patent document are by way of illustration only and should not be construed in any way to limit its scope. Those skilled in the art will understand that the principles described herein may be implemented in any type of suitably arranged non-volatile memory (NVM) device.

To simplify the drawings, reference numerals from previous drawings will sometimes not be repeated for structures that have already been identified.

To better provide a thorough explanation of the technical advantages of the present disclosure, a description of two prior art devices will first be given.

Figure 2:
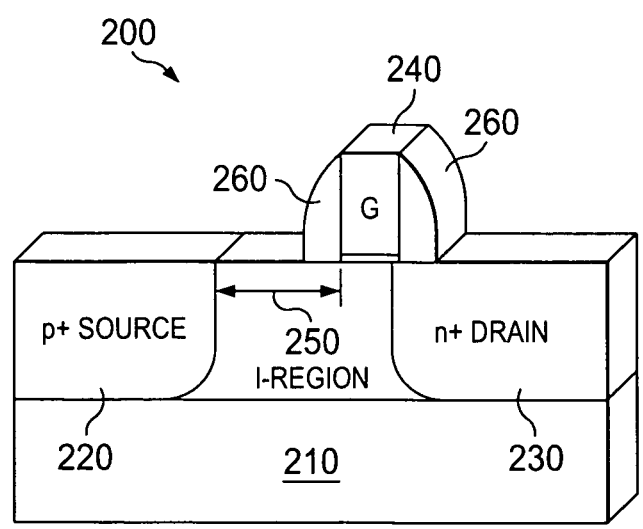
FIG. 2 is a diagram illustrating a cross sectional side view of a prior art impact ionization metal oxide semiconductor (I-MOS) device.

The first prior art device is an impact ionization metal oxide semiconductor (I-MOS) device 200, as shown in a cross sectional side view in FIG. 2. The I-MOS device 200 includes a buried oxide (BOX) substrate 210, a p+ source region 220, an n+ drain region 230, and a gate structure 240. As shown in FIG. 2, an ionization impact region 250 is located between the p+ source region 220 and the gate structure 240. The sides of the gate structure 240 are supported by sidewall spacer structures 260.

The I-MOS device 200 operates as a gated p-i-n diode that is reverse biased for avalanche breakdown of carriers to occur. The I-MOS device 200 is capable of achieving a sub-60 millivolt per decade subthreshold swing. This provides faster and more efficient carrier generation. A more detailed description of the operation of the I-MOS device 200 is given in an article by K. Gopalakrishnan et al., IEDM 2002.

FIG. 3A is a diagram illustrating an energy band diagram for an "off state" of the prior art I-MOS device 200 (of FIG. 2) while FIG. 3B is a diagram illustrating an energy band diagram for an "on state."

FIG. 4 is a table diagram illustrating the operating voltages for the prior art I-MOS device 200 shown in FIG. 2. In the "off state" the source voltage $V_S$ has a negative bias voltage (−), the drain voltage $V_D$ has a positive bias voltage (+), and the gate voltage $V_G$ is at a ground (GND) voltage. In the "off state" the leakage current is the minority carrier drift.

In the "on state" the source voltage $V_S$ has a negative bias voltage (−), the drain voltage $V_D$ has a positive bias voltage (+), and the gate voltage $V_G$ has a positive bias voltage (+). The gate brings the conduction band in the channel down, thus creating a high field region in the ionization impact region 250. This is shown in the energy band diagram for the "on state" illustrated in FIG. 3B. At a sufficiently large electric field, impact ionization occurs. This leads to an avalanche breakdown that creates a large number of hot electron carriers. The hot electron carriers flow to the drain structure 230. This mode of operation also achieves high amplification with a sub-60 millivolt per decade subthreshold swing.

The second prior art device is a tunneling field effect transistor (TFET) device 500, as shown in a cross sectional side view in FIG. 5. The TFET device 500 includes a buried oxide (BOX) substrate 510, a p+ source region 520, an n+ drain region 530, a "p" halo pocket 540 and a gate structure 550. As shown in FIG. 5, the gate structure 550 is located over the p+ source region 520 and the "p" halo pocket 540. The sides of the gate structure 550 are supported by sidewall spacer structures 560.

The TFET device 500 operates as a "p" channel tunneling transistor. A more detailed description of the operation of the TFET device 500 is given in an article by C. Hu et al., VLSI-TSA 2008.

FIG. 6A is a diagram illustrating an energy band diagram for an "off state" of the prior art TFET device 500 (of FIG. 5) while FIG. 6B is a diagram illustrating an energy band diagram for an "on state."

FIG. 7 is a table diagram illustrating the operating voltages for the prior art TFET device 500 shown in FIG. 5. In the "off state" the source voltage $V_S$ has a negative bias voltage (−), the drain voltage $V_D$ is at a ground (GND) voltage, and the gate voltage $V_G$ is at a ground (GND) voltage. In the "off state" the leakage current is the minority carrier drift, and is extremely low. This results in low power consumption.

In the "on state" the source voltage $V_S$ has a negative bias voltage (−), the drain voltage $V_D$ is at a ground (GND) voltage, and the gate voltage $V_G$ has a negative bias voltage (−). The gate raises the energy band diagram in the channel, thus allowing holes to tunnel from the conduction band in the drain to the valance band in the channel when the tunneling width is narrow. This achieves high amplification with excellent subthreshold swing at low power. This is shown in the energy band diagram for the "on state" shown in FIG. 6B.

Figure 8:
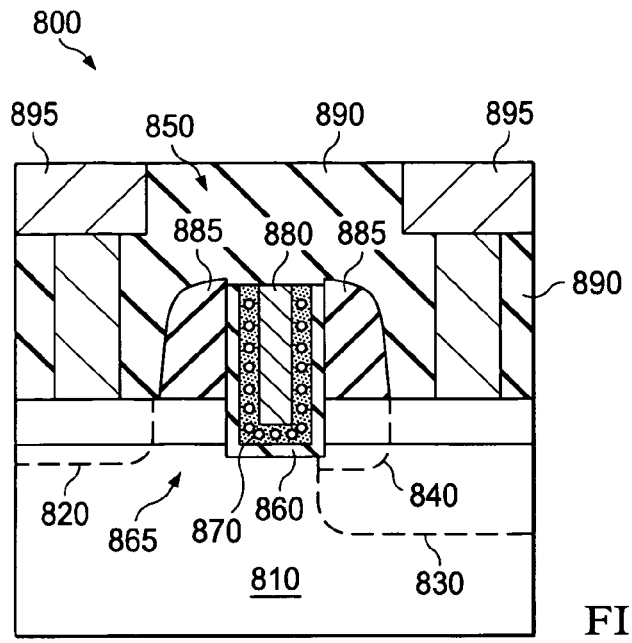
FIG. 8 is a diagram illustrating an advantageous embodiment of an impact ionization tunneling (IT) non-volatile memory (NVM) device of the present disclosure.

FIG. 8 is a diagram illustrating a cross sectional view of one embodiment of an impact ionization tunneling (IT) non-volatile memory (NVM) device 800 in accordance the principles of the present disclosure. As will further described in more detail, the IT NVM device 800 employs an impact ionization process for writing and employs a band-to-band tunneling process for reading. Thus, in the write mode the IT NVM device 800 functions in accordance with one process, and in the read mode it functions in accordance with another process. The IT NVM device 800 may be formed on a bulk substrate or on a Silicon On Insulator (SOI) substrate. The floating gate of the IT NVM device 800 may be formed from polysilicon, nitride, nanocrystals, a combination thereof, or any other suitable charge storage material. In one specific embodiment, the floating gate includes nanocrystals.

The IT NVM device 800 includes a substrate 810, a p+ source region 820, an n+ drain region 830, a "p" halo pocket 840 and a gate structure 850. The "p" halo pocket 840 helps enhance band-to-band tunneling for read operations. The "p" halo pocket 840 is optional in that tunneling can still occur even if no halo pocket is present.

The gate structure 850 includes a tunnel oxide layer 860, a floating gate 870, and a control gate 880 as shown in FIG. 8. As will be later described in more detail, the tunnel oxide layer 860 may be formed in an aperture from which a dummy stack structure has been removed. The floating gate 870 is formed on the tunnel oxide layer 860 and the control gate 880 is formed on the floating gate 870, as shown. The sides of the gate structure 850 (having the tunnel oxide layer 860 as the outer layer) are supported by sidewall spacer structures 885.

As shown in FIG. 8, the floating gate 870 is formed with a base and vertical walls. The vertical walls of the floating gate 870 are positioned substantially perpendicular to the channel so that the hot carrier electrons generated in the channel can be injected directly into the floating gate 870.

The gate structure 850 is disposed above the substrate 810 at a location that is adjacent to the "p" halo pocket 840. An ionization impact region 865 is located between the p+ source 820 and the tunnel oxide layer 860 of the gate structure 850. FIG. 8 illustrates the IT NVM device 800 covered with an oxide layer 890 and metal layers 895 extending (e.g., via/contact structures) through the oxide layer 890 to the p+ source region 820 and to the n+ drain region 830.

Figure 9A:
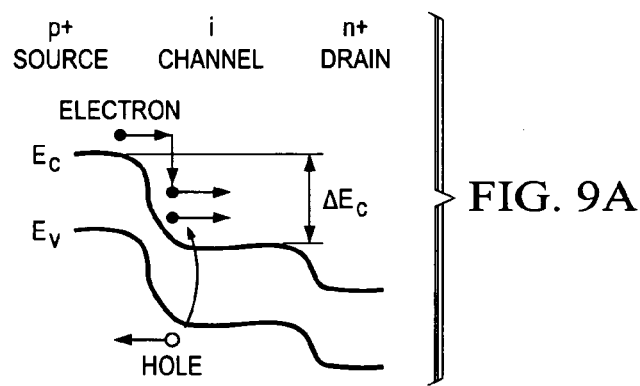
FIG. 9A is a diagram illustrating an energy band diagram for a "program state" of the impact ionization tunneling (IT) non-volatile memory (NVM) device shown in FIG. 8.
Figure 9B:
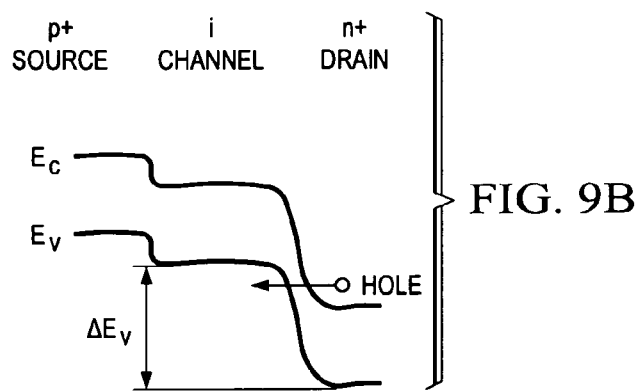
FIG. 9B is a diagram illustrating an energy band diagram for a "read state" of the impact ionization tunneling (IT) non-volatile memory (NVM) device shown in FIG. 8.

FIG. 9A is a diagram illustrating an energy band diagram for a "program state" (or "write state") for the IT NVM device 800 (in FIG. 8) while FIG. 9B is a diagram illustrating an energy band diagram for a "read state."

FIG. 10 is a table diagram illustrating the operating voltages for the IT NVM device 800. In the IT NVM "program state" (or "write state") the source voltage $V_S$ has a negative bias voltage (−), the drain voltage $V_D$ has a positive bias voltage (+), the gate voltage $V_G$ has a positive bias voltage (+), and the substrate voltage $V_{sub}$ is at a ground (GND) voltage. The "program state" (or "write state") of the IT NVM device 800 corresponds to the "on state" of the prior art I-MOS device 200, whereby in this case the hot electrons are injected directly into the floating gate 870.

In the IT NVM "read state" the source voltage $V_S$ has a negative bias voltage (−), the drain voltage $V_D$ is at a ground (GND) voltage, the gate voltage $V_G$ has a negative bias voltage (−), and the substrate voltage $V_{sub}$ is at a ground (GND) voltage. The "read state" of the IT NVM device 800 corresponds to the "on state" of the prior art TFET device 500.

In the IT NVM "erase state" the source voltage $V_S$ and the drain voltage $V_D$ and the substrate voltage $V_{sub}$ are all at a ground (GND) level. The gate voltage $V_G$ has a positive bias voltage (+). This causes the electrons to be pumped out of the floating gate 870 by the Fowler-Nordheim tunneling process.

During a write operation, the IT NVM device 800 employs the impact ionization process. The IT NVM device 800 operates as a gated p-i-n diode that is reverse biased for avalanche breakdown of carriers to occur. The IT NVM device 800 is capable of achieving a sub-60 millivolt per decade subthreshold swing. This provides faster and more efficient carrier generation.

During a read operation, the IT NVM device 800 employs the band-to-band tunneling process. The band-to-band tunneling process enables sub-60 millivolt per decade swing transfer characteristics with an ultra-low off-state leakage current. The "p" halo pocket 840 allows for steeper subthreshold swing and higher drive current. As a result, a higher gain and faster reading with low power consumption can be achieved.

Band engineered materials can be easily incorporated into the structure of the IT NVM device 800. The use of band engineered materials enables voltage scaling and efficient carrier generation/injection to enhance impact ionization or band-to-band tunneling. A more detailed description of how band engineered materials enable voltage scaling and efficient carrier generation to enhance impact-ionization and band-to-band tunneling is given in an article by E.-H. Toh et al. entitled "A Complementary-I-MOS Technology Featuring SiGe Channel and I-region For Enhancement of Impact-ionization, Breakdown Voltage, and Performance", ESSDERC 2007, and in an article by G. Samudra et al., entitled "Simulation of Material and Strain Engineering of Tunneling Field-Effect Transistor with Subthreshold Swing Below 60 mV/decade", SSDM 2008.

Narrower bandgap enhances impact-ionization rates and carrier generation even at a lower voltage. This enables voltage scaling with much better performance. Similarly for tunneling, narrower bandgap favors tunneling and thereby allows a device to operate at a lower voltage with better performance.

The main concept is to have narrower bandgap material at the source/drain region. If the growth of the material is difficult, the whole substrate and source/drain region could also be made of the same material. Vdd scaling is performed with narrower bandgap material (more particularly at the source/drain regions). As previously mentioned, the narrower bandgap material enhances impact-ionization and band-to-band tunneling. This allows the device to operate at a lower voltage with equivalent or superior performance.

FIG. 11 through FIG. 22 are diagrams that illustrate a series of steps of one embodiment of a method or process for manufacturing the IT NVM device 800. After a substrate 1110 is provided, an active area is formed in the substrate 1110 and a dummy gate stack is formed. The resulting structure 1100 is shown in FIG. 11. The active area is designated with reference numeral 1110. A dummy gate base is designated with reference numeral 1120 and the dummy gate stack is designated with reference numeral 1130.

Figure 13:
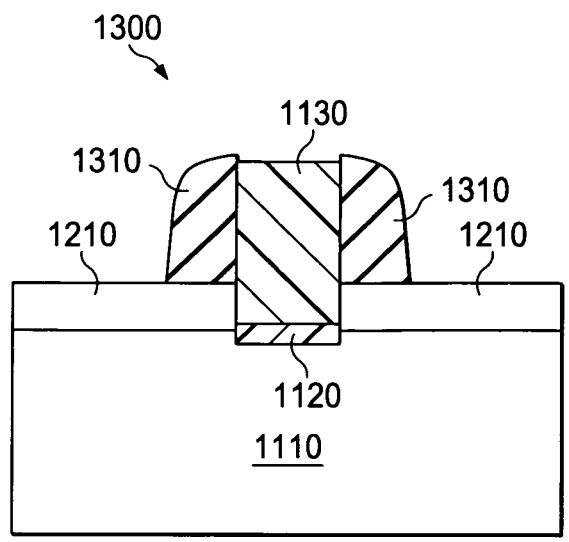

A selective epitaxial growth (SEG) of narrow bandgap material (e.g., silicon germanium (SiGe)) 1210 is formed over the substrate 1110. In one advantageous embodiment, the narrow bandgap material has a thickness that is in a range of twenty nanometers (20 nm) to sixty nanometers (60 nm). In other advantageous embodiments, the thickness may be more than sixty nanometers (60 nm) for an increased area for programming. The resulting structure 1200 is shown in FIG. 12. Sidewall spacer structures 1310 are formed in positions adjacent to the dummy gate stack 1130, as shown. This resulting structure 1300 is shown in FIG. 13.

Figure 14:
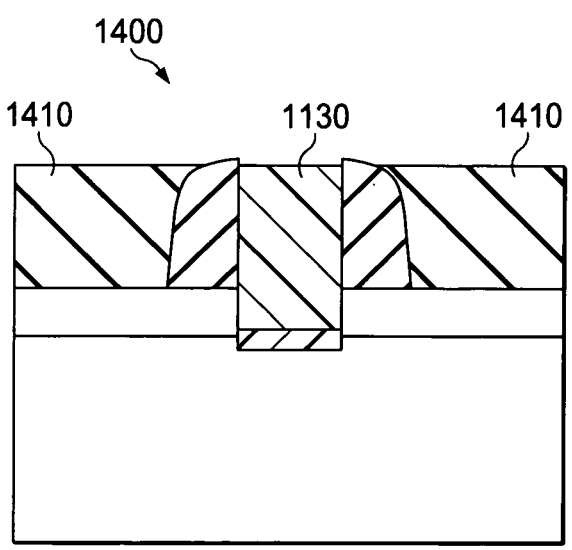

An interlayer dielectric (ILD) 1410 (e.g., oxide) is deposited over the structure 1300. Chemical mechanical polishing (CMP) may be performed to smooth the surface of the interlayer dielectric (ILD) 1410. The resulting structure 1400 is shown in FIG. 14.

Figure 15:
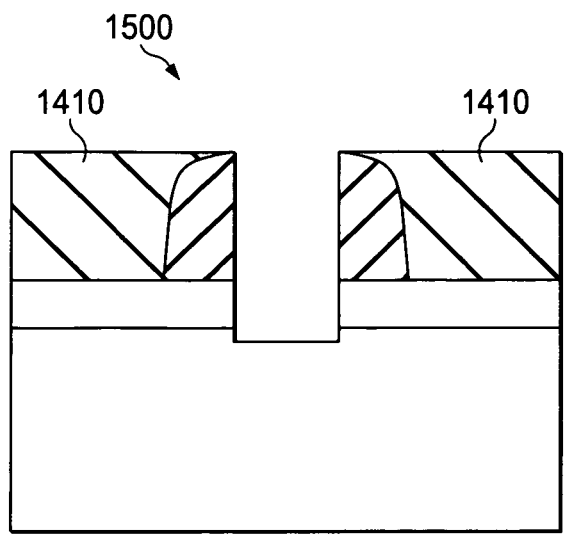

The dummy gate stack 1130 is selectively removed from the structure 1400 by any suitable process. The removal of the dummy gate stack 1130 and the resulting structure 1500 is shown in FIG. 15. The resulting structure 1500 has a void, trench or aperture (hereinafter "aperture") where the dummy gate stack 1130 was removed.

Figure 16:
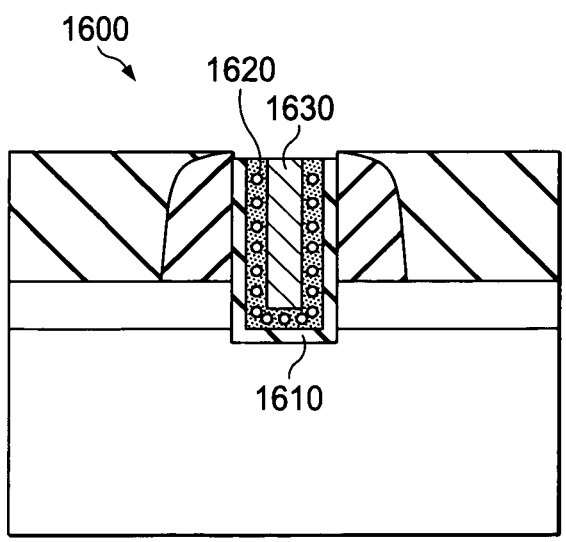

As shown in FIG. 16, a layer of tunnel oxide 1610 is formed within the aperture, and a floating gate layer 1620 is formed over the layer of tunnel oxide 1610. A control gate layer 1630 is formed over the floating gate layer 1620. The three layers (tunnel oxide 1610, floating gate 1620, control gate 1630) fill the aperture that was formed by the removal of the dummy gate stack 1130. Chemical mechanical polishing (CMP) may be performed to smooth the top exposed surfaces of the tunnel oxide 1610, floating gate 1620, and control gate 1630. The resulting structure 1600 is shown in FIG. 16.

Figure 17:
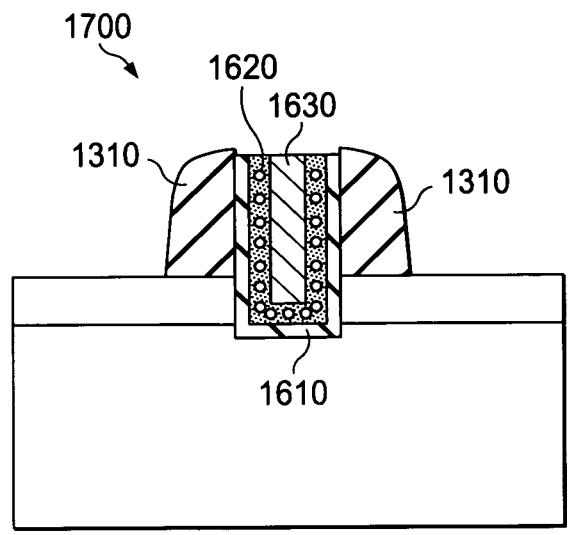

The ILD 1410 is selectively removed and the resulting structure 1700 is shown in FIG. 17.

Figure 18:
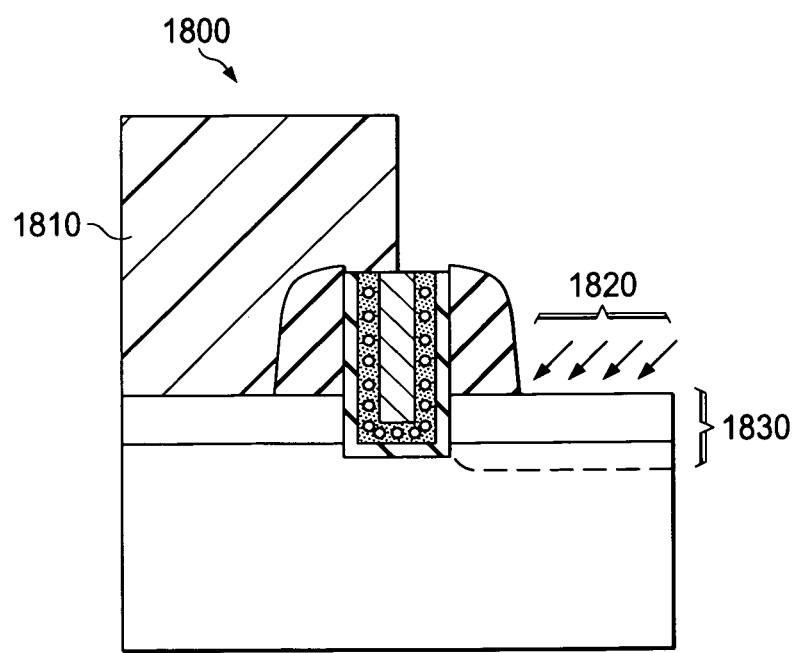

As shown in FIG. 18, a first portion (approximately one-half) of the structure 1700 is covered with a first protective resist (PR) mask 1810 at a location a source region will be subsequently formed. Turning to FIG. 18, a second portion of the structure 1700 is exposed to a p-type dopant implantation process at a relatively large tilt angle. The p-type implantation process 1820 is represented by the arrows 1820 and forms a p-type region 1830 within the bandgap layer 1210 and extends a distance into the substrate 1110. The resulting structure 1800 is shown in FIG. 18.

Figure 19:
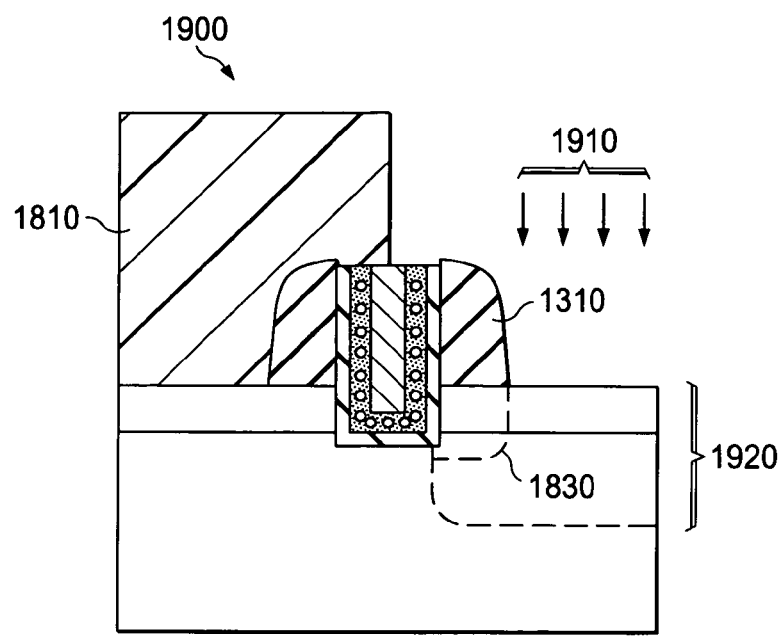

Now turning to FIG. 19, the exposed first portion of the structure 1800 is exposed to an n-type dopant implantation process at an angle. In one advantageous embodiment, the angle is substantially perpendicular. This implantation process is represented by the vertical arrows 1910 and forms an n-type drain region 1920 within the bandgap layer 1210 and extends into the substrate 1110. Formation of the n-type drain region 1920 in this manner as shown in FIG. 19 forms a p-type dopant halo region 1830 under the spacer 1310 and adjacent the tunneling oxide 1610. The resulting structure 1900 is shown in FIG. 19.

Figure 20:
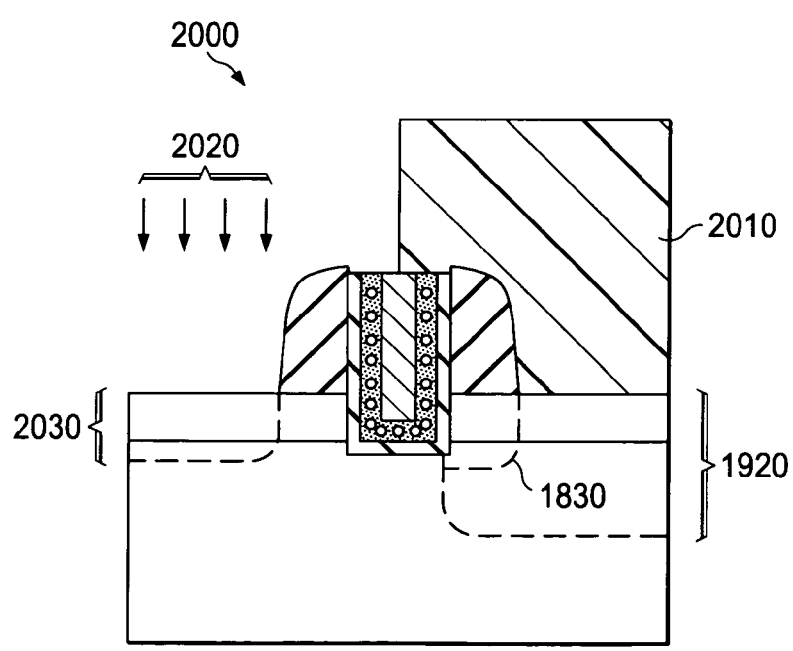

After formation of the drain region 1920, the first protective resist (PR) mask 1810 is removed and a second protective resist (PR) mask 2010 is placed over the second portion of the structure that contains the location where the n-type drain region 1920 has been formed. Then as shown in FIG. 20, the exposed first portion of the structure is exposed to a p-type dopant implantation process at an angle. In one advantageous embodiment, the angle is a substantially perpendicular angle. The implantation process is represented by the vertical arrows 2020 and forms a p-type source region 2030 within the bandgap layer 1210 and extends a distance into the substrate 1110. The resulting structure 2000 is shown in FIG. 20.

Figure 21:
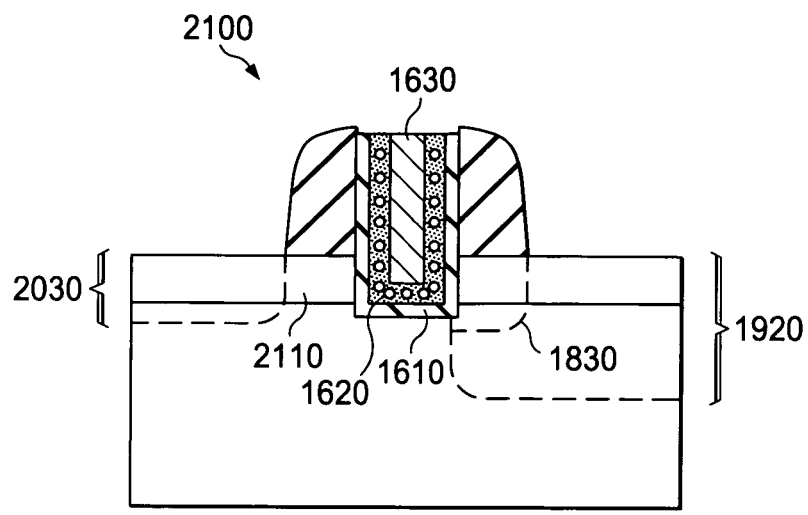

The second protective resist (PR) mask 2010 is removed, a rapid thermal annealing (RTA) process is performed, and a silicidation process is performed to form silicide on the source region 2030 and the drain region 1920. The resulting structure 2100 is shown in FIG. 21. As shown in FIG. 21, an impact ionization region 2110 is located between the source region 2030 and a vertical wall of the tunnel oxide 1610.

Figure 22:
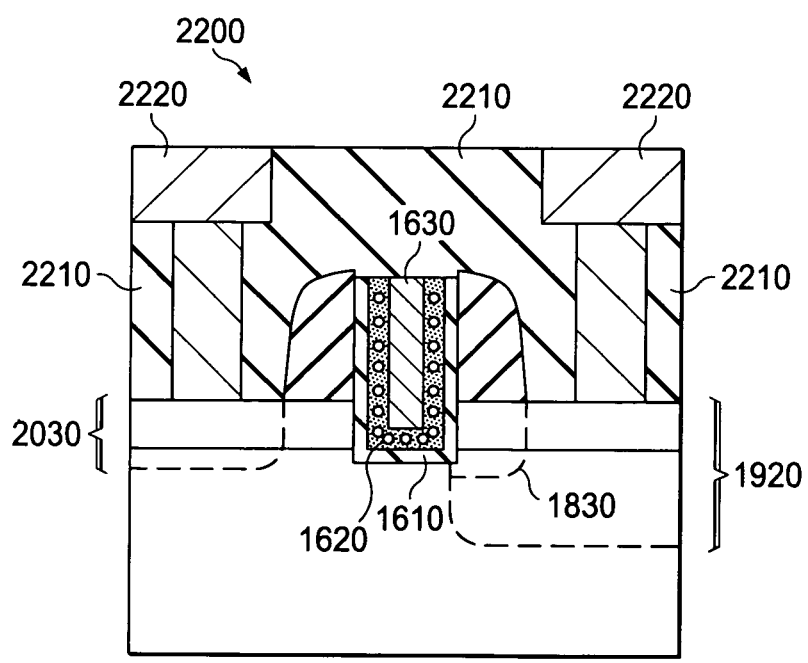

The resulting structure 2100 is covered with an oxide layer 2210 and metal layers or connectors 2220 extending (e.g., via/contact structures) through the oxide layer 2210 to the p+ source region 2030 and to the n+ drain region 1920. The resulting structure 2200 is shown in FIG. 22.

Figure 23:
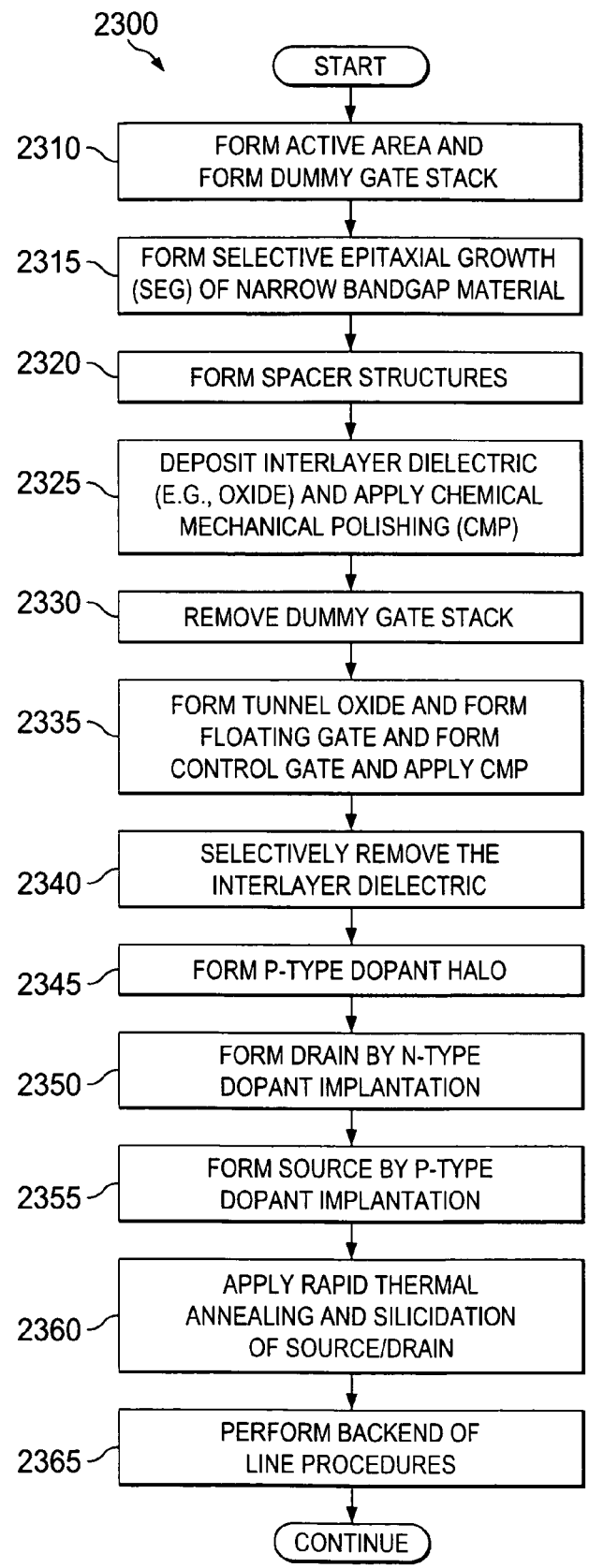
FIG. 23 is a diagram illustrating a flowchart of one embodiment of a method or process for manufacturing an impact ionization tunneling (IT) non-volatile memory (NVM) device in accordance with the present disclosure.

Now turning to FIG. 23, there is shown a flowchart illustrating one embodiment of a method or process 2300 of forming or manufacturing an impact ionization tunneling (IT) non-volatile memory (NVM) device, such as device 800. This summarizes the manufacturing steps that have been previously described.

In the first step, an active area and a dummy stack gate are formed on a substrate (step 2310). A selective epitaxial growth (SEG) of narrow bandgap material is formed (step 2315) on the substrate. Sidewall spacer structures are formed (step 2320), an interlayer dielectric material (e.g., oxide) is formed, and a chemical mechanical polishing (CMP) process may be performed (step 2325).

The dummy gate stack is removed (step 2330). Next, (1) a tunnel oxide is formed within the aperture that results from the removal of the dummy gate stack, (2) a floating gate is formed over the tunnel oxide, (3) a control gate is formed over the floating gate, and (4) a chemical mechanical polishing (CMP) process may be performed (step 2335). The interlayer dielectric is then selectively removed (step 2340).

A p-type dopant region is formed in at a location where a drain region will subsequently be formed (step 2345). The drain region is then formed using n-type dopant (step 2350) resulting in a p-type halo region within the n-type drain region. The source region is formed using a p-type dopant (step 2355).

Rapid thermal annealing (RTA) and silicidation are performed on the source and drain regions (step 2360). Backend of line procedures are performed to cover the structure with an oxide layer and form metal connections through the oxide layer down to the source and drain regions (step 2365).

Figure 24:
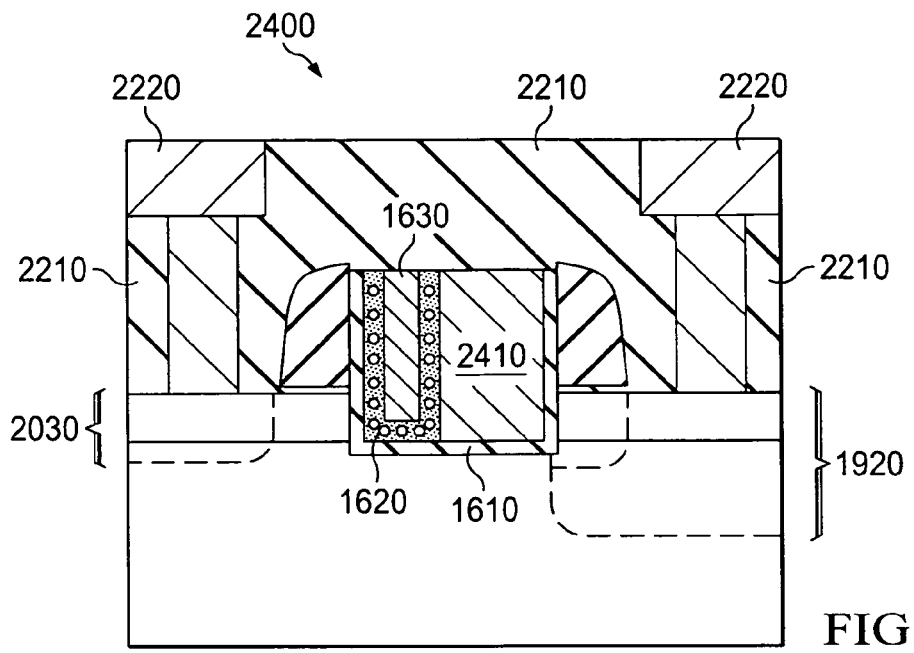
FIG. 24 is a diagram illustrating one embodiment of an impact ionization tunneling (IT) non-volatile memory (NVM) device having a select gate structure.

FIG. 24 is a diagram illustrating another embodiment of an impact ionization tunneling (IT) non-volatile memory (NVM) device 2400 in accordance with the present disclosure that includes a select gate structure 2410. The control gate and the select gate are separately connected to a metal layer. The select gate allows the memory cells that are connected to the select gate to be assessed/selected by forming an electrically conductive region under it. This effectively extends the drain region to the control gate so that normal operations like reading/writing can be carried out.

As shown in FIG. 24, the select gate structure 2410 is formed adjacent to the gate structure 850 including the tunnel oxide 860, 1610, the floating gate 870, 1620 and the control gate 880, 1630. The tunnel oxide 830, 1610 is disposed between the select gate structure 2410 and the substrate, and also disposed between at least a portion of a sidewall of the select gate structure 2410 at a location substantially adjacent to the drain region 1920.

Figure 25:
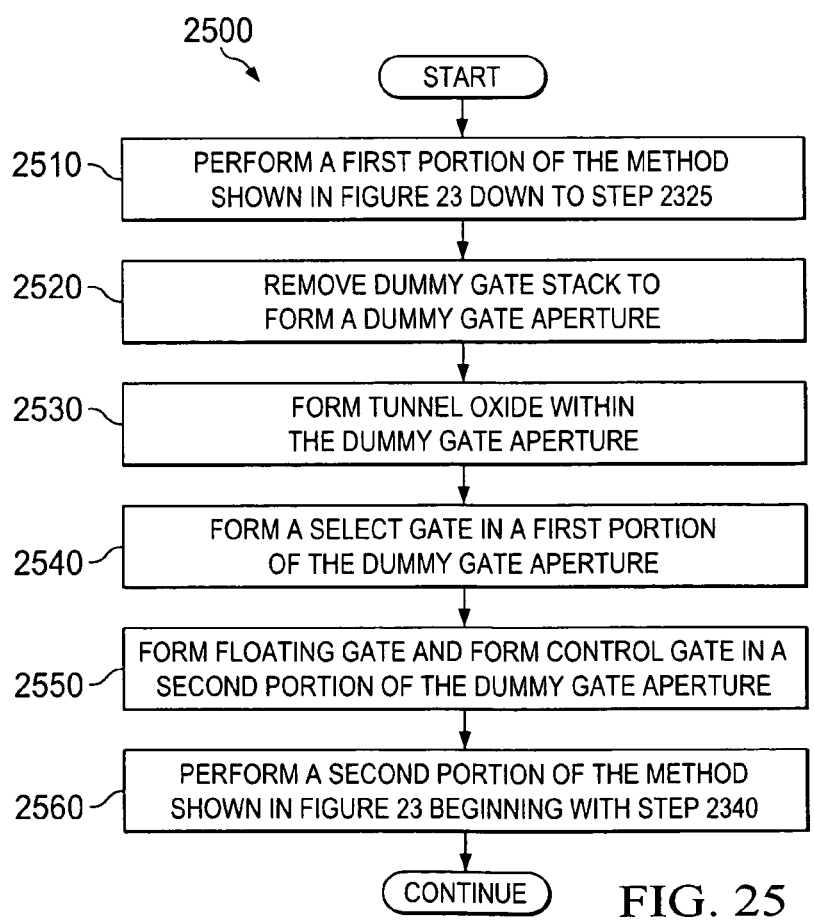
FIG. 25 is a diagram illustrating a flowchart of one embodiment of a method or process for manufacturing an impact ionization tunneling (IT) non-volatile memory (NVM) device having a select gate structure.

FIG. 25 is a diagram illustrating a flowchart of one embodiment of a method or process 2500 for manufacturing the IT NVM device 2400 having the select gate structure 2410.

Certain processing is the same as shown and described in the process 2300 of FIG. 23. The steps of the process 2300 are performed from the beginning down to step 2325 (step 2510). The dummy gate stack is removed to form a dummy gate aperture (step 2520) and a tunnel oxide 1610 is formed within the dummy gate aperture (step 2530). A separate gate oxide other than the tunnel gate oxide could be formed here first (if a different oxide thickness is needed). Then after a select gate is formed (as described below) the gate oxide at the control gate region is etched away, followed by the tunnel oxide, and so on.

Next, within a first portion of the dummy gate aperture, the select gate structure 2410 is formed (step 2540). A floating gate 1620 and a control gate 1630 are formed in a second portion of the dummy gate aperture that is lined with tunnel oxide 1610 (step 2550). Thereafter, the remainder of the steps in the process 2300 shown in FIG. 23 are performed beginning with step 2340 (step 2560).

It will be understood that well known processes have not been described in detail and have been omitted for brevity. Although specific steps, structures and materials may have been described, the present disclosure may not limited to these specifics, and others may substituted as is well understood by those skilled in the art, and various steps may not necessarily be performed in the sequences shown.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A method of manufacturing a non-volatile memory device, the method comprising:
   providing a substrate;
   forming a source region within the substrate, the source region comprising dopants of a first conductivity type;
   forming a drain region within the substrate, the drain region comprising dopants of a second conductivity type;
   forming a gate structure having at least a portion embedded in the substrate between the source region and the drain region, and wherein the gate structure comprises a tunnel oxide layer, a floating gate formed over the tunnel oxide layer and a control gate formed over the floating gate;
   forming an ionization impact region between the source region and the gate structure; and
   forming a halo region in the drain region at a location adjacent the gate structure, the halo region comprising dopants of the first conductivity type.

2. The method as set forth in claim 1 further comprising:
   forming a select gate structure at a location adjacent to the gate structure and having at least a portion positioned between the gate structure and the drain region.

3. The method as set forth in claim 1 further comprising:
   forming a select gate structure adjacent the floating gate, the select gate structure having a top surface substantially planar to both a top surface of the control gate and a top surface of the floating gate, a first sidewall adjacent a vertical wall of the floating gate, and a second sidewall and a bottom surface adjacent the tunnel oxide layer.

4. The method as set forth in claim 1 further comprising:
   forming a halo region within the drain region and doping the halo region with dopants of the first conductivity type.

5. A non-volatile memory device comprising:
   a silicon substrate having a narrow bandgap layer of material disposed thereabove;
   a source region having dopants of a first type disposed within a portion of the narrow bandgap layer and within a portion of the silicon substrate;
   a drain region having dopants of a second type disposed within a portion of the narrow bandgap layer and within a portion of the silicon substrate;
   a halo region formed as a portion of the drain region, the halo region having dopants of the first type;
   at least a portion of a gate structure embedded within the bandgap layer of material between the source region and the drain region, the gate structure comprising a tunnel oxide layer, a floating gate formed over the tunnel oxide layer and a control gate formed over the floating gate;
   an impact ionization region disposed between the source region and the gate structure; and
   wherein the memory device is configured to perform a write operation using an ionization impact process and perform a read operation using a tunneling process.

6. The non-volatile memory device as set forth in claim 5 further comprising:
   a select gate comprising,
      a top surface substantially planar to both a top surface of the control gate and a top surface of the floating gate,
      a first sidewall adjacent a vertical wall of the floating gate, and
      a second sidewall and a bottom surface adjacent the tunnel oxide layer.

7. A non-volatile memory device configured to perform a write operation using an ionization impact process and perform a read operation using a tunneling process, the memory device further comprising:
   a substrate;
   a source region within the substrate and having a first conductivity;
   a drain region within the substrate and having a second conductivity;
   a metal connector contacting the drain region;
   a gate structure comprising,
      a tunnel oxide layer,
      a floating gate formed over the tunnel oxide layer, and
      a control gate formed over the floating gate; and
   a halo region formed within the drain region wherein the halo region is located adjacent to the gate structure and comprises dopants of the first conductivity type.

8. The non-volatile memory device as set forth in claim 7, wherein a portion of the tunnel oxide layer is formed as a vertical wall substantially adjacent to the halo region, and the halo region is disposed within the drain region and has a depth less than a depth of the drain region.

* * * * *